United States Patent
Shi (10) Patent No.: US 8,324,614 B2
(45) Date of Patent: Dec. 4, 2012

(54) ELECTROLUMINESCENT DEVICES EMPLOYING ORGANIC CATHODES

(75) Inventor: Yijian Shi, Mountain View, CA (US)

(73) Assignee: SRI International, Menlo Park, CA (US)

(*) Notice: Subject to any disclaimer, the term of this patent is extended or adjusted under 35 U.S.C. 154(b) by 218 days.

(21) Appl. No.: 12/674,882

(22) PCT Filed: Aug. 25, 2008

(86) PCT No.: PCT/US2008/010075
§ 371 (c)(1),
(2), (4) Date: Oct. 28, 2010

(87) PCT Pub. No.: WO2009/025870
PCT Pub. Date: Feb. 26, 2009

(65) Prior Publication Data
US 2011/0163299 A1   Jul. 7, 2011

Related U.S. Application Data

(60) Provisional application No. 60/957,481, filed on Aug. 23, 2007.

(51) Int. Cl.
*H01L 29/08* (2006.01)
*H01L 35/24* (2006.01)
*H01L 51/00* (2006.01)

(52) U.S. Cl. ........... 257/40; 257/E51.027; 257/E51.018; 438/46; 438/99

(58) Field of Classification Search ............ 257/40, 257/E51.027, E51.018; 438/46, 99
See application file for complete search history.

(56) References Cited

U.S. PATENT DOCUMENTS

| 5,246,738 | A | 9/1993 | Blum |
| 6,326,936 | B1 | 12/2001 | Inganas et al. |
| 6,339,289 | B1 | 1/2002 | Fork |
| 6,593,687 | B1 | 7/2003 | Pei et al. |
| 6,856,089 | B2 | 2/2005 | Hosokawa et al. |
| 6,998,773 | B2 | 2/2006 | Hosokawa et al. |
| 2004/0217344 | A1 | 11/2004 | Chu et al. |
| 2008/0238310 | A1 | 10/2008 | Forrest et al. |
| 2008/0248240 | A1 | 10/2008 | Shi |
| 2008/0265757 | A1 | 10/2008 | Forrest et al. |
| 2009/0042142 | A1 | 2/2009 | Baldo et al. |
| 2011/0042657 | A1 | 2/2011 | Shi |

FOREIGN PATENT DOCUMENTS

| EP | 1997814 | 12/2008 |
| WO | 99/08325 | 2/1999 |

(Continued)

OTHER PUBLICATIONS

Simon et al., "Fixed p-i-n junction polymer light-emitting electrochemical cells based on charged self-assembled monolayers," Applied Physics Letters, Mar. 6, 2007, 90(10), p. 103508.

(Continued)

*Primary Examiner* — Telly Green
(74) *Attorney, Agent, or Firm* — Richard Aron Osman; Isaac Rutenberg (57) ABSTRACT

The disclosure provides methods, materials, and devices suitable for use in electroluminescent devices. In one embodiment, for example, there is provided a layered cathode comprising a metal substrate and an intermediate organic or organometallic layer having an electron accepting group. The intermediate layer provides an interface with an overlaying electroluminescent layer. The disclosure finds utility, for example, in the field of microelectronic devices.

15 Claims, 5 Drawing Sheets

FOREIGN PATENT DOCUMENTS

| | | |
|---|---|---|
| WO | 2006/077514 | 7/2006 |
| WO | 2006/116584 | 11/2006 |

OTHER PUBLICATIONS

Lee et al., "Modification of an ITO anode with a hole-transporting SAM for improved OLED device characteristics," J. Mat. Chem., Oct. 4, 2002, 12(4), pp. 3494-3498 (Abstract Only).

Manna et al., "Enhanced carrier injection of organic light emitting devices using self assembled monolayer in the cathode/organic interface," Thin Solid Films, Jan. 20, 2006, 495(1-2), pp. 380-384.

Shi et al., "Improved electron injection in organic light-emitting devices with a lithium acetylacetonate [Li(acac)]/ aluminum bilayer cathode," Semiconductor Science and Technology, Mar. 1, 2007, 22(3), pp. 249-252.

International Search Report and IPRP for PCT/US2008/010075.

ELECTROLUMINESCENT DEVICES EMPLOYING ORGANIC CATHODES

CROSS-REFERENCE TO RELATED APPLICATIONS

This application claims priority under 35 U.S.C. 119(e) to U.S. Provisional Application Ser. No. 60/957,481, filed Aug. 23, 2007, the disclosure of which is incorporated herein by reference.

TECHNICAL FIELD

The present disclosure is directed to electroluminescent devices having metal cathodes coated with a layer comprising a combination of an electron-accepting unit and an adhesive material. Methods for making such devices are further provided. The disclosure finds utility, for example, in the field of electronics.

BACKGROUND

Electroluminescent devices such as light emitting diodes (LEDs) have in recent years included the use of organic materials as one or more of the device components. Organic materials are desirable for their light weight and low cost. Unfortunately, many organic materials suffer from low stability and low durability as compared with metallic materials.

Electroluminescent devices (ELDs) are typically constructed with two electrodes. An electroluminescent material is in electrical contact with both electrodes, and forms a conduction path between the electrodes. One electrode functions as a electron-injection layer, while the other electrode functions as a hole-injection layer.

High efficiency PLED/OLED devices rely on a cathode which has sufficiently low work function so that electron can be injected into the polymer easily. Traditional approach uses low work function metals, such as calcium and barium metal, to facilitate the efficient electron injection into the light-emitting polymers. Since these metals are chemically very reactive, they can be easily destroyed by trace of moisture from air. In order for the device to have a reasonably long lifetime, these devices not only need to be fabricated and encapsulated in an inert gas environment, a desiccant is usually packaged internally to extend the device life (see drawing below). Even though, the current lifetime of a full color OLED display is still <10,000 hours, which is insufficient for many applications. The decay of cathode is proven to be one of the several key factors that have significant influence on the device life. Therefore, development of environmentally stable and low work function cathode for OLED remaining an important topic in OLED industry.

In addition, the use of internal desiccant not only increases the complexity and cost of manufacturing, it also increases the weight and the dimension of the display product. In certain applications requires harsh environment and/or strong mechanical vibrations, the desiccant approach may not be viable. This is because large change of temperature and/or strong vibration may cause stripping of the desiccant, which may result in device failure. Thus, development of more stable cathode remains one of the key issues towards the commercialization of OLED displays.

The use of more stable metals such as Aluminum, copper, gold, etc., can improve the resistance of the cathode to moisture and oxygen, thus potentially eliminating the need of desiccant and reducing the requirement for hermetic encapsulation. However, the work function of these metals is usually too high to match the LUMO orbital of the light-emitting polymer (LEP) and results in a large energy gap for electron injection into the LUMO of the LEP.

There remains a need in the art to overcome these drawbacks, as well as generally to develop new methods and materials for ELDs. Ideal ELDs would be robust and efficient, with an extended operational lifespan. An ideal method for preparing ELDs would utilize materials that are readily available or easily prepared, would minimize the number of process steps, and would provide highly reproducible results.

SUMMARY OF THE DISCLOSURE

The present disclosure is directed to addressing one or more of the abovementioned drawbacks, and to providing ELDs and methods of preparing such devices that meet one or more of the abovementioned desired characteristics.

In one embodiment, then, the disclosure provides an electroluminescent device (ELD) comprising an electron injection layer comprising a silicon-containing adhesive material and an electron-accepting moiety.

In another embodiment, the disclosure provides a method for forming an electron injection layer in an electroluminescent device. The method comprises: providing a metal or metal oxide surface having exposed hydroxyl groups; and forming a coating layer on the surface, wherein the coating layer is covalently bonded to the surface and comprises an electron accepting group.

In another embodiment, the disclosure provides a method for preparing a layered substrate for use in an electroluminescent device. The method comprises: providing a metal or metal oxide surface having exposed hydroxyl groups; and forming a cross-linked ceramic layer comprising an electron-accepting moiety, wherein the cross-linked ceramic layer is covalently attached to the surface through oxygen linkages.

In another embodiment, the disclosure provides a method for preparing a layered device. The method comprises providing a surface having exposed hydroxyl groups, applying to the surface a composition comprising a metal diketonate and a preceramic material, and applying energy such that the preceramic material forms a cross-linked network covalently attached to the surface.

In another embodiment, the disclosure provides an improved method for preparing an electroluminescent device. The improvement comprises forming a cross-linked silicon-containing coating layer covalently attached to a cathode surface, wherein the coating layer comprises an electron-accepting moiety selected from an organic moiety covalently attached to the coating layer and a metal diketonate complexed with the coating layer.

In another embodiment, the disclosure provides an improved method for preparing an electroluminescent device. The improvement comprises combining a preceramic siloxane material with a metal diketonate to form a mixture, and applying the mixture to a cathode surface having exposed hydroxyl groups to form a substrate covalently attached to a ceramic coating.

DETAILED DESCRIPTION OF THE DISCLOSURE

Before describing the present invention in detail, it is to be understood that unless otherwise indicated, this invention is not limited to any particular device, architecture, material, or method of preparation described herein, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, "a metal" refers not only to a single metal but also to a combination of two or more metals (e.g., mixtures or alloys), "an electrode" refers to a combination of electrodes as well as to a single electrode, and the like.

Unless defined otherwise, all technical and scientific terms used herein have the meaning commonly understood by one of ordinary skill in the art to which the invention pertains. Although any methods and materials similar or equivalent to those described herein may be useful in the practice or testing of the present invention, preferred methods and materials are described below.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although again not necessarily, alkyl groups herein may contain 1 to about 18 carbon atoms, and such groups may contain 1 to about 12 carbon atoms. The term "lower alkyl" intends an alkyl group of 1 to 6 carbon atoms. "Substituted alkyl" refers to alkyl substituted with one or more substituent groups, and the terms "heteroatom-containing alkyl" and "heteroalkyl" refer to an alkyl substituent in which at least one carbon atom is replaced with a heteroatom, as described in further detail infra. If not otherwise indicated, the terms "alkyl" and "lower alkyl" include linear, branched, cyclic, unsubstituted, substituted, and/or heteroatom-containing alkyl or lower alkyl, respectively.

The term "alkenyl" as used herein refers to a linear, branched or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. Generally, although again not necessarily, alkenyl groups herein may contain 2 to about 18 carbon atoms, and for example may contain 2 to 12 carbon atoms. The term "lower alkenyl" intends an alkenyl group of 2 to 6 carbon atoms. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl, respectively.

The term "alkynyl" as used herein refers to a linear or branched hydrocarbon group of 2 to 24 carbon atoms containing at least one triple bond, such as ethynyl, n-propynyl, and the like. Generally, although again not necessarily, alkynyl groups herein may contain 2 to about 18 carbon atoms, and such groups may further contain 2 to 12 carbon atoms. The term "lower alkynyl" intends an alkynyl group of 2 to 6 carbon atoms. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the terms "alkynyl" and "lower alkynyl" include linear, branched, unsubstituted, substituted, and/or heteroatom-containing alkynyl and lower alkynyl, respectively.

If not otherwise indicated, the term "unsaturated alkyl" includes alkenyl and alkynyl, as well as combinations thereof.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms, and includes, for example, methoxy, ethoxy, n-propoxy, isopropoxy, t-butyloxy, etc. Substituents identified as "$C_1$-$C_6$ alkoxy" or "lower alkoxy" herein may, for example, may contain 1 to 3 carbon atoms, and as a further example, such substituents may contain 1 or 2 carbon atoms (i.e., methoxy and ethoxy).

The term "aryl" as used herein, and unless otherwise specified, refers to an aromatic substituent generally, although not necessarily, containing 5 to 30 carbon atoms and containing a single aromatic ring or multiple aromatic rings (such as 1 to 3 rings) that are fused together, directly linked, or indirectly linked (such that the different aromatic rings are bound to a common group such as a methylene or ethylene moiety). Aryl groups may, for example, contain 5 to 20 carbon atoms, and as a further example, aryl groups may contain 5 to 12 carbon atoms. For example, aryl groups may contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to an aryl substituent, in which at least one carbon atom is replaced with a heteroatom, as will be described in further detail infra. If not otherwise indicated, the term "aryl" includes unsubstituted, substituted, and/or heteroatom-containing aryl substituents.

The term "aralkyl" refers to an alkyl group with an aryl substituent, and the term "alkaryl" refers to an aryl group with an alkyl substituent, wherein "alkyl" and "aryl" are as defined above. In general, aralkyl and alkaryl groups herein contain 6 to 30 carbon atoms. Aralkyl and alkaryl groups may, for example, contain 6 to 20 carbon atoms, and as a further example, such groups may contain 6 to 12 carbon atoms.

The term "olefinic group" intends a mono-unsaturated or di-unsaturated hydrocarbon group of 2 to 12 carbon atoms. Preferred olefinic groups within this class are sometimes herein designated as "lower olefinic groups," intending a hydrocarbon moiety of 2 to 6 carbon atoms containing a single terminal double bond. The latter moieties may also be termed "lower alkenyl."

The term "alkylene" as used herein refers to a difunctional saturated branched or unbranched hydrocarbon chain containing from 1 to 24 carbon atoms. "Lower alkylene" refers to alkylene linkages containing from 1 to 6 carbon atoms, and includes, for example, methylene (—$CH_2$—), ethylene (—$CH_2CH_2$—), propylene (—$CH_2CH_2CH_2$—), 2-methylpropylene (—$CH_2$—$CH(CH_3)$—$CH_2$—), hexylene (—$(CH_2)_6$—) and the like.

The term "amino" is used herein to refer to the group —$NZ^1Z^2$ wherein $Z^1$ and $Z^2$ are hydrogen or nonhydrogen substituents, with nonhydrogen substituents including, for example, alkyl, aryl, alkenyl, aralkyl, and substituted and/or heteroatom-containing variants thereof.

The term "heteroatom-containing" as in a "heteroatom-containing alkyl group" (also termed a "heteroalkyl" group) or a "heteroatom-containing aryl group" (also termed a "heteroaryl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and heteroaromatic" respectively refer to "aryl" and "aromatic" substituents that are heteroatom-containing, and the like. Examples of heteroalkyl groups include alkoxyaryl, alkylsulfanyl-substituted alkyl, N-alkylated amino alkyl, and the like. Examples of heteroaryl substituents include pyrrolyl, pyrrolidinyl, pyridinyl, quinolinyl, indolyl, furyl, pyrimidinyl, imidazolyl, 1,2,4-triazolyl, tetrazolyl, etc., and examples of heteroatom-containing alicyclic groups are pyrrolidino, morpholino, piperazino, piperidino, tetrahydrofuranyl, etc.

"Hydrocarbyl" refers to univalent hydrocarbyl radicals containing 1 to about 30 carbon atoms, including 1 to about 24 carbon atoms, further including 1 to about 18 carbon atoms, and further including about 1 to 12 carbon atoms, including linear, branched, cyclic, saturated and unsaturated species, such as alkyl groups, alkenyl groups, aryl groups, and the like. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroa tom. Unless otherwise indicated, the term "hydrocarbyl" is to be interpreted as including unsubstituted, substituted, heteroatom-containing, and substituted heteroatom-containing hydrocarbyl moieties.

"Halo" or "halogen" refers to fluoro, chloro, bromo or iodo, and usually relates to halo substitution for a hydrogen atom in an organic compound. Of the halos, chloro and fluoro are generally preferred.

By "substituted" as in "substituted hydrocarbyl," "substituted alkyl," "substituted aryl," and the like, as alluded to in some of the aforementioned definitions, is meant that in the hydrocarbyl, alkyl, aryl, or other moiety, at least one hydrogen atom bound to a carbon (or other) atom is replaced with one or more non-hydrogen substituents. Examples of such substituents include, without limitation: functional groups such as halo, hydroxyl, sulfhydryl, $C_1$-$C_{24}$ alkoxy, $C_2$-$C_{24}$ alkenyloxy, $C_2$-$C_{24}$ alkynyloxy, $C_5$-$C_{20}$ aryloxy, acyl (including $C_2$-$C_{24}$ alkylcarbonyl (—CO-alkyl) and $C_6$-$C_{20}$ arylcarbonyl (—CO-aryl)), acyloxy (—O-acyl), $C_2$-$C_{24}$ alkoxycarbonyl (—(CO)—O-alkyl), $C_6$-$C_{20}$ aryloxycarbonyl (—(CO)—O-aryl), halocarbonyl (—CO)—X where X is halo), $C_2$-$C_{24}$ alkylcarbonato (—O—(CO)—O-alkyl), $C_6$-$C_{20}$ arylcarbonato (—O—(CO)—O-aryl), carboxy (—COOH), carboxylato (—COO$^-$), carbamoyl (—(CO)—$NH_2$), mono-substituted $C_1$-$C_{24}$ alkylcarbamoyl (—(CO)—NH($C_1$-$C_{24}$ alkyl)), di-substituted alkylcarbamoyl (—(CO)—N($C_1$-$C_{24}$ alkyl)$_2$), mono-substituted arylcarbamoyl (—(CO)—NH-aryl), thiocarbamoyl (—(CS)—$NH_2$), carbamido (—NH—(CO)—$NH_2$), cyano (—C≡N), isocyano (—N$^+$≡C$^-$), cyanato (—O—C≡N), isocyanato (—O—N$^+$≡C$^-$), isothiocyanato (—S—C≡N), azido (—N=N$^+$=N$^-$), formyl (—(CO)—H), thioformyl (—(CS)—H), amino (—$NH_2$), mono- and di-($C_1$-$C_{24}$ alkyl)-substituted amino, mono- and di-($C_5$-$C_{20}$ aryl)-substituted amino, $C_2$-$C_{24}$ alkylamido (—NH—(CO)-alkyl), $C_5$-$C_{20}$ arylamido (—NH—(CO)-aryl), imino (—CR=NH where R=hydrogen, $C_1$-$C_{24}$ alkyl, $C_5$-$C_{20}$ aryl, $C_6$-$C_{20}$ alkaryl, $C_6$-$C_{20}$ aralkyl, etc.), alkylimino (—CR=N(alkyl), where R=hydrogen, alkyl, aryl, alkaryl, etc.), arylimino (—CR=N(aryl), where R=hydrogen, alkyl, aryl, alkaryl, etc.), nitro (—$NO_2$), nitroso (—NO), sulfo (—$SO_2$—OH), sulfonato (—$SO_2$—O$^-$), $C_1$-$C_{24}$ alkylsulfanyl (—S-alkyl; also termed "alkylthio"), arylsulfanyl (—S-aryl; also termed "arylthio"), $C_1$-$C_{24}$ alkylsulfinyl (—(SO)-alkyl), $C_5$-$C_{20}$ arylsulfinyl (—(SO)-aryl), $C_1$-$C_{24}$ alkylsulfonyl (—$SO_2$-alkyl), $C_5$-$C_{20}$ arylsulfonyl (—$SO_2$-aryl), phosphono (—P(O)(OH)$_2$), phosphonato (—P(O)(O$^-$)$_2$), phosphinato (—P(O)(O$^-$)), phospho (—$PO_2$), and phosphino (—$PH_2$), mono- and di-($C_1$-$C_{24}$ alkyl)-substituted phosphino, mono- and di-($C_5$-$C_{20}$ aryl)-substituted phosphino; and the hydrocarbyl moieties $C_1$-$C_{24}$ alkyl (including $C_1$-$C_{18}$ alkyl, further including $C_1$-$C_{12}$ alkyl, and further including $C_1$-$C_6$ alkyl), $C_2$-$C_{24}$ alkenyl (including $C_2$-$C_{18}$ alkenyl, further including $C_2$-$C_{12}$ alkenyl, and further including $C_2$-$C_6$ alkenyl), $C_2$-$C_{24}$ alkynyl (including $C_2$-$C_{18}$ alkynyl, further including $C_2$-$C_{12}$ alkynyl, and further including $C_2$-$C_6$ alkynyl), $C_5$-$C_{30}$ aryl (including $C_5$-$C_{20}$ aryl, and further including $C_5$-$C_{12}$ aryl), and $C_6$-$C_{30}$ aralkyl (including $C_6$-$C_{20}$ aralkyl, and further including $C_6$-$C_{12}$ aralkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated.

When the term "substituted" appears prior to a list of possible substituted groups, it is intended that the term apply to every member of that group. For example, the phrase "substituted alkyl and aryl" is to be interpreted as "substituted alkyl and substituted aryl."

Unless otherwise specified, reference to an atom is meant to include isotopes of that atom. For example, reference to H is meant to include $^1$H, $^2$H (i.e., D) and $^3$H (i.e., T), and reference to C is meant to include $^{12}$C and all isotopes of carbon (such as $^{13}$C).

In one embodiment, then, a method is disclosed for providing an electron-accepting moiety in an intermediate layer between a cathode and an electroluminescent (EL) material of an ELD. Although not wishing to be bound by theory, it is believed that the electron accepting moiety provides an energy-matching interface between the cathode and the EL material. The electron accepting moiety can be selected to have a LUMO that is similar in energy to the LUMO of the EL material. Furthermore, the electron accepting moiety withdraws and/or accepts electrons from the cathode material with minimal loss in energy from the electron transfer. The intermediate layer therefore provides a mechanism for increasing the efficiency of energy transfer across the junction between the cathode and the EL material. In preferred embodiments, the intermediate layer is deposited in a thin layer on the cathode material, followed by deposition of the EL layer. In preferred embodiments, the EL material is a light-emitting polymer (LEP).

In some preferred embodiments, an organic species comprising an electron accepting group is used in the intermediate coating layer between the cathode and EL material. The organic species (and therefore the electron accepting group) is covalently attached to the cathode. The combination of the intermediate coating layer and the cathode is suitable as an electron-injection layer in an ELD.

In a first example, the intermediate layer is constructed in a step-wise fashion. A cathode having a surface is provided. The cathode comprises hydroxyl groups exposed on the surface of the cathode. The cathode surface is functionalized by reacting the exposed hydroxyl groups with a linking compound. The linking compound forms a layer on the cathode that acts as an adhesive for an electron-accepting moiety, which is described in more detail below. The linking compound comprises a linking group that reacts with the exposed hydroxyl groups of the cathode. In preferred embodiments, the linking compound is a silane derivative. Particularly preferred are trialkoxysilane derivatives such as trimethoxysilane and triethoxysilane derivatives. Such compounds form a cross-linked network by reacting with the exposed hydroxyl groups of the cathode.

The linking compound further comprises a first functional group, so that the linking compound forms a functionalized surface when attached to the cathode. The first functional group may be any group that does not react with the hydroxyl groups on the cathode surface, and furthermore does not react with the linking group on the linking compound. Alternatively, the first functional group may be a protected form of the linking group. Alternatively, the first functional group may react less preferentially with the exposed hydroxyl groups as compared with the reactivity of the linking group. In all of these cases, it is preferred that most or all of the reaction between the linking compound and the exposed hydroxyl groups occurs through the linking groups. Preferred functional groups include amine groups and protected amine groups. Since the linking compound is covalently attached to the cathode through the linking group, the linking compound provides functional groups that are surface-bound to the cathode. In some embodiments, it may be necessary to remove protecting groups from the first functional group once the linking compound has been covalently attached to the surface.

The intermediate layer is completed by providing an organic species comprising an electron accepting group and a reactive group capable of reacting with the first functional group of the linking compound. It will be appreciated that the identity of the reactive group on the organic species will vary according to the reactivity of the first functional group. Preferred organic species capable of reacting with the first functional group of the linking compound include compounds having dicarboxylic acid and/or corresponding anhydride moieties, acyl halides (such as acyl chloride) of such carboxylic acid compounds/derivatives, or esters of such compounds.

The activated forms of such compounds (e.g., acyl halides) allow reaction with the functional group under more mild conditions and lower temperatures. Preferred organic species furthermore comprise aromatic and/or conjugated groups to assist electron mobility (i.e., provide electron-accepting properties).

For example, preferred organic species may have the structure of formula (I)

(I)

wherein, in formula (I):

$R^1$ is —C(=O)—$X^1$, wherein $X^1$ is selected from —$OX^2$ and halide;

$R^2$, $R^3$, $R^4$, $R^5$, and $R^6$ are independently selected from H, hydrocarbyl, and a functional group; and $X^2$ is selected from a bond, H or a hydrocarbyl group.

Any two or more adjacent groups selected from $R^1$, $R^2$, $R^3$, $R^4$, $R^5$, and $R^6$ may be taken together to form a cyclic group. The cyclic group may comprising one or more rings, any of which may be aromatic or aliphatic. The cyclic group may further comprise a system of annulated rings.

In some preferred embodiments of formula (I), $R^1$ and $R^2$ are both carboxylic acid groups, or are hydrocarbyl groups substituted with a carboxylic acid group.

In some preferred embodiments of formula (I), $R^1$ and $R^2$ are taken together to form a cycle. For example, in one embodiment, $R^1$ and $R^2$ are taken together and have the formula —C(=O)—O—C(=O)—, such that the organic species has the structure of formula (Ia)

(Ia)

wherein $R^3$, $R^4$, $R^5$, and $R^6$ are as defined previously.

In some preferred embodiments of formula (I), $R^1$, $R^2$, and $R^3$ are taken together to form a cyclic group, such that the organic species has the structure of formula (Ib)

(Ib)

wherein $R^4$, $R^5$, and $R^6$ are as defined previously, and $R^7$, $R^8$, and $R^9$ are as defined for $R^2$-$R^6$.

In some preferred embodiments of formula (I), (Ia), and (Ib), the organic species is symmetrical, or based upon a symmetrical core. For example, in formula (Ia), a symmetrical compound may results when $R^4$ and $R^5$ are taken together and have the formula —C(=O)—O—C(=O)—. As a further example, in formula (Ib), a symmetrical compound may results when $R^4$ and $R^9$ are taken together and have the formula —C(=O)—O—C(=O)—.

In some preferred embodiments, $R^1$ and $R^2$ are taken together to form a cycle, and $R^3$-$R^9$ are independently selected from H, lower alkyl, lower alkenyl, lower alkynyl, $C_5$-$C_{30}$ aryl, $C_6$-$C_{30}$ aralkyl, $C_6$-$C_{30}$ alkaryl, and functional groups. For example, $R^3$-$R^9$ are independently selected from electron withdrawing groups that include, without limitation, halo groups (including fluorine), a nitro group, and aryl groups.

In some preferred embodiments of formula (I), two adjacent substituents selected from $R^2$-$R^6$ are taken together to form a cycle, wherein the cycle comprises one or more heteroatoms. For example, R4 and R5 may be taken together and have the formula —NH—CH=N—, such that the organic species has the structure of formula (Ic)

(Ic)

wherein $R^1$, $R^2$, $R^3$, and $R^6$ are as defined previously.

Example preferred organic species include, as non-limiting examples, compounds (3)-(15).

(3)

(4)

(5)

(6)

-continued (7)
(8)
(9)
(10)
(11)
(12)
(13)
(14)

-continued (15)

In preferred embodiments wherein the functional group on the linking compound is an amine group, the organic species reacts with the amine group and attaches to the cathode. In such embodiments, the organic cathode will comprise an intermediate layer comprising an electron-accepting moiety having the structure of formula (Id)

(Id)

wherein, in formula (Id):

$R^{1a}$ is selected from H and a bond, provided that when $R^{1a}$ is a bond, then $R^{1a}$ and $R^2$ are taken together to form a cycle;

$R^2$, $R^3$, $R^4$, $R^5$, and $R^6$ are as defined previously; and the wavy line represents the point of attachment of the organic species to the linking compound. In preferred embodiments, $R^{1a}$ is a bond, $R^2$ is acyl, and $R^{1a}$ and $R^2$ are taken together to form a cycle, such that the organic cathode comprises an intermediate layer with an electron-accepting moiety having the structure of formula (Ie)

(Ie)

wherein $R^2$, $R^3$, $R^4$, $R^5$, $R^6$, and the wavy line are as defined previously.

The step-wise procedure for preparing the intermediate layer is exemplified by Scheme 1, which is provided merely for the purpose of illustration and not limitation. In the example shown in Scheme 1, a cathode with a hydroxyl-functionalized surface is provided at (a). The hydroxyl-functionalized substrate is reacted with aminophenyltrimethoxysilane (compound 1) to form a functionalized surface, shown at (b). Subsequently, in one embodiment shown in Scheme 1, the functionalized surface is reacted with 5-benzimidazolecarboxylic acid (compound 2) to form a cathode with an intermediate layer covalently attached, as shown at (c). Alternatively, the functionalized surface is reacted with phthalic anhydride to provide the surface shown at (d). Upon the application of heat, a cyclization reaction provides the final electron-accepting moiety in a covalently-attached intermediate layer, as shown at (e).

Scheme 1.

For devices constructed using compound 8, for example, the formed organic cathode provides an additional reactive site (the NH₂ group) for possible further extension of the organic cathode chain vertically. For example, in Scheme II, a functionalized surface (shown at (a)) is reacted with compound (8), followed by heat, to provide the functionalized intermediate surface shown at (b). The functionalized intermediate surface is then reacted with a compound such as any one of compounds 3-15, followed by heat, to form the extended intermediate layer shown at (c). The reaction to further extend the organic cathode chain may use any of the organic species disclosed herein as appropriate, such as any of compounds 3-15 or any compounds containing the carboxylic acid or acid anhydride group. This chain extension method may be used with any of the compounds disclosed herein when suitable modified to contain an additional reactive site.

Scheme II

(b)

(c)

For compounds containing a second anhydride group, such as compounds 9-10 and 14-15, the second anhydride group can be used as the reaction site for extension. Thus, as shown in Scheme III, the functionalized surface shown at (a) is reacted with a compound having two anhydride groups, to provide the functionalized intermediate surface shown at (b). The functionalized intermediate surface can undergo an internal reaction so as to form the "horizontal" organic cathode shown at (c), or, alternatively, can be extended via reaction with another amine-containing compound to provide the surface shown at (d). It will be appreciated that the internal reaction shown in Scheme III (i.e., to prepare surface (c)) can be promoted, for example, by forming intermediate layers with a high density of surface-bound amine groups, or by using anhydride compounds with large, flexible aromatic moieties.

Scheme III (d)

The method of preparing the intermediate layer may further include a curing step. For example, when the linking moieties are Si—O bonds (as exemplified in Scheme 1), the process may include curing by heating the substrate to provide a cross-linked ceramic network. It will be appreciated that, where a step-wise method is used to provide the intermediate layer, the curing may be accomplished before or after attaching the organic species containing the electron-accepting group. It will further be appreciated that, in some cases, there is no need to induce the curing reaction (e.g., by applying heat), as such reaction will occur spontaneously. In preferred embodiments, any byproducts that result from the curing reaction are small molecules (e.g., water, methanol, and the like) that are conveniently removed by solvent washes.

In a second example, the intermediate layer is constructed directly from an organic species that comprises both an electron accepting group as well as a linking group capable of forming covalent bonds with exposed hydroxyl groups on the cathode surface. As with the step-wise example, described above, a cathode having a surface is provided. The cathode comprises hydroxyl groups exposed on the surface of the cathode. The intermediate layer is formed on the cathode via reaction between the exposed hydroxyl groups and the linking group of the organic species.

The organic species comprises both an electron accepting group as well as a linking group. Preferred linking groups, described above, are those capable of forming covalent bonds with the exposed hydroxyl groups of the substrate (e.g., silane derivatives such as trialkoxysilane groups). Preferred electron accepting groups are also described above. In some preferred embodiments, the organic species has the structure of formula (II)

(II)

wherein, in formula II, $R^2$-$R^6$ are as defined as previously, and $R^{10}$ is a hydrocarbyl group that comprises a linking group capable of forming covalent bonds with exposed hydroxyl groups on the cathode surface. Furthermore, $R^{10}$ may be taken together with one or more of $R^2$-$R^6$ to form a cyclic structure.

In some preferred embodiments of formula (II), $R^{10}$ comprises a trialkoxysilane group. For example, R10 comprises a trimethoxysilane group. Also in some preferred embodiments of formula (II), $R^{10}$ and $R^2$ are taken together to form a cycle. For example, $R^{10}$ and $R^2$ are taken together and have the structure —C(=O)—$NR^{11}$—C(=O)—, where $R^{11}$ is a functional group capable of forming covalent bonds with exposed hydroxyl groups on the cathode surface, or $R^{11}$ is a hydrocarbyl group that comprises the linking group. For example, R11 may be —$C_6H_4$—$Si(OCH_3)_3$. Further non-limiting examples of organic species include modified forms of compounds (3)-(15), wherein the compounds are modified to contain linking moieties as described herein.

When forming an intermediate layer using an organic species comprising both a linking moiety and an electron accepting group, it will again be appreciated that in some instances a curing step is necessary in order to form a more robust and stable intermediate layer. As described above for the step-wise method, the curing reaction may be a spontaneous reaction that occurs upon covalent attachment of the organic species to the substrate, or may require initiation such as with the application of heat.

In other preferred embodiments, an organometallic complex provides the electron accepting group. The organometallic complex is mixed with a pre-adhesive material and then applied to the cathode. The pre-adhesive material covalently attaches to the hydroxyl groups at the cathode surface, thereby forming an intermediate layer covalently attached to the cathode and comprising the electron accepting group. The combination of the cathode and intermediate layer is suitable as an electron-injection layer in an ELD.

The pre-adhesive material (also referred to herein as a preceramic material) can be any suitable material that forms covalent bonds with exposed hydroxyl groups on the substrate. In a preferred embodiment, the pre-adhesive material forms a cross-linked network that includes covalent attachments to the substrate.

As an example, the pre-adhesive materials may have the structure of the preceramic materials described in U.S. Pat. No. 5,246,738 to Blum, issued Sep. 21, 1993 ("Hydridosiloxanes as Precursors to Ceramic Products"), the disclosure of which is hereby incorporated by reference.

As a further example, the pre-adhesive material may have the structure of formula (III):

(III)

wherein $R^{12}$ is hydrocarbyl. In preferred embodiments, $R^{12}$ is selected from $C_1$-$C_{20}$ alkyl, $C_2$-$C_{20}$ alkenyl, $C_2$-$C_{20}$ alkynyl, $C_5$-$C_{20}$ aryl, $C_6$-$C_{20}$ aralkyl, and $C_5$-$C_{20}$ alkaryl. In further preferred embodiments, $R^{12}$ is selected from substituted or unsubstituted $C_1$-$C_{20}$ alkyl, substitute or unsubstituted heteroatom-containing $C_1$-$C_{20}$ alkyl, substituted or unsubstituted $C_2$-$C_{20}$ alkenyl, substitute or unsubstituted heteroatom-containing $C_2$-$C_{20}$ alkenyl, substituted or unsubstituted $C_2$-$C_{20}$ alkynyl, substitute or unsubstituted heteroatom-containing $C_2$-$C_{20}$ alkynyl, substituted or unsubstituted $C_5$-$C_{20}$ aryl, substitute or unsubstituted $C_5$-$C_{20}$ heteroaryl, substituted or unsubstituted $C_5$-$C_{20}$ aralkyl, substitute or unsubstituted heteroatom-containing $C_5$-$C_{20}$ aralkyl, substituted or unsubstituted $C_6$-$C_{20}$ alkaryl, and substitute or unsubstituted heteroatom-containing $C_5$-$C_{20}$ alkaryl. In preferred embodiments, $R^{12}$ is lower alkyl, such as, for example, methyl. Furthermore in formula (III), n is an integer that is greater than or equal to 1. Accordingly, monomers, dimers, trimers, and higher-order materials such as pre-polymers and polymers are possible. It will be appreciated that the pre-adhesive material may comprise a mixture of different compounds having the structure of formula (III) but having various values of n.

Upon reaction of the pre-adhesive material having the structure of formula (III) with the exposed hydroxyl groups of the cathode, the electron-injection layer will comprise an intermediate layer attached to the cathode surface, wherein the intermediate layer comprises polymeric units having the structure of formula (IIIa):

(IIIa)

wherein $R^{12}$ is as defined previously, and the wavy line represents a point of attachment to the cathode surface.

Preferred organometallic complexes are metal diketonates. Particularly preferred metal diketonates include lithium acetylacetonate, barium acetylacetonate, beryllium acetylacetonate, calcium acetylacetonate, magnesium acetylacetonate, sodium acetylacetonate, potassium acetylacetonate, cesium acetylacetonate, strontium acetylacetonate, boron acetylacetonate, aluminum acetylacetonate, gallium acetylacetonate, indium acetylacetonate, silver acetylacetonate, and combinations thereof.

The cathode may be formed of any appropriate material that either contains or can be modified to contain exposed hydroxyl groups. Preferred cathodes are metals such as aluminum, titanium, copper, tungsten, silver, and the like, as well as other materials such as Indium Tin Oxide (ITO). Exposed hydroxyl groups may be provided on the surface of the cathode in any appropriate manner. In some embodiments, for example, the exposed hydroxyl groups result from oxidation when the cathode material is exposed to ambient conditions (i.e., air). In other embodiments, the exposed hydroxyl groups result from a chemical oxidation reaction performed prior to the deposition of the intermediate coating layer. Thus, in some embodiments, the cathode comprises a metal coated with a layer of metal oxide. The metal oxide may be formed by oxidizing the metal of the cathode, or may be formed by depositing a separate metal oxide layer over the cathode material. In preferred embodiments, the layer of metal oxide is a thin layer, e.g., between the thickness of a monolayer and less than about 10 μm, or less than about 1 μm, or less than about 0.1 μm.

The cathode layer may function both as an electrode and as a structural support (i.e., a substrate). In some embodiments, however, the cathode material is deposited onto a separate substrate material that provides structural support. Any appropriate substrate material may be used.

In the synthesis of the organic cathode, the attachment reaction of the linking compound or pre-ceramic material to the surface generally influences the thickness of the intermediate layer (e.g., silane layer) deposited on the metal electrode surface, and thus influences device performance, such as device brightness, operating voltage, and efficiency. Thinner, denser layers are preferable in order to reduce operating voltage and increase efficiency.

Figure 1A:
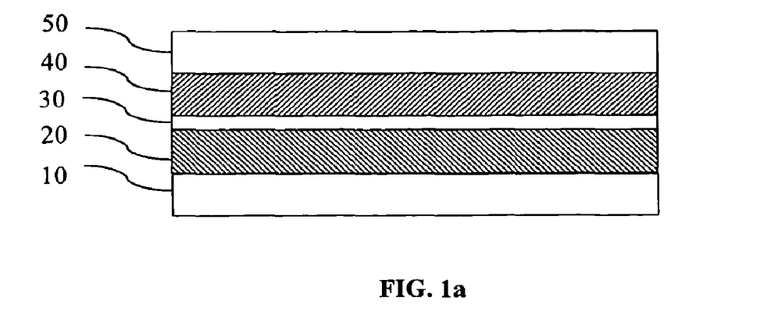
FIGS. 1a, 1b, and 1c depicts examples of electroluminescent devices according to the disclosure.

A variety of ELD structures may be used with the materials and methods of the disclosure. For example, a conventional layered ("sandwich") device is suitable. In such a device, an example of which is depicted in FIG. 1a, substrate 10 is covered by cathode material 20. Intermediate coating 30 is covalently attached to substrate 10. Electroluminescent layer 40 is disposed on and in contact with intermediate coating 30, and the anode layer 50 is in contact with electroluminescent layer 40. The various component layers (i.e., anode, EL material, intermediate, and cathode) are substantially uniform across the entire substrate. Also suitable are device structures disclosed in U.S. Pat. No. 6,593,687, issued Jul. 15, 2003, and titled "Cavity-emission electroluminescent device and method for forming the device," the disclosure of which is incorporated by reference herein in its entirety.

Also suitable are device structures disclosed in U.S. patent application Ser. No. 11/900,478, filed Sep. 11, 2007, and titled "Cavity electroluminescent devices and method for producing the same," the disclosure of which is incorporated by reference herein in its entirety.

As an example, a cavity-emission ELD structure is suitable for the methods and structures disclosed herein. Thus, the devices of the disclosure may comprise a layered structure comprising a hole-injection electrode layer, an electron-injection electrode layer and a dielectric layer interposed between the hole-injecting and electron-injecting electrode layers. A cavity extends through at least the dielectric layer and one of the electrode layers and has an interior cavity surface comprising a hole-injection electrode region, an electron-injection electrode region and a dielectric region. In some preferred embodiments, the cavity extends through both electrode layers and the dielectric layer. An electroluminescent coating material is provided in electrical contact with the hole-injection and electron-injection electrode regions of the interior cavity surface. An intermediate layer according to the disclosure is provided between the electroluminescent coating material and the electron-injection layer.

Figure 1B:
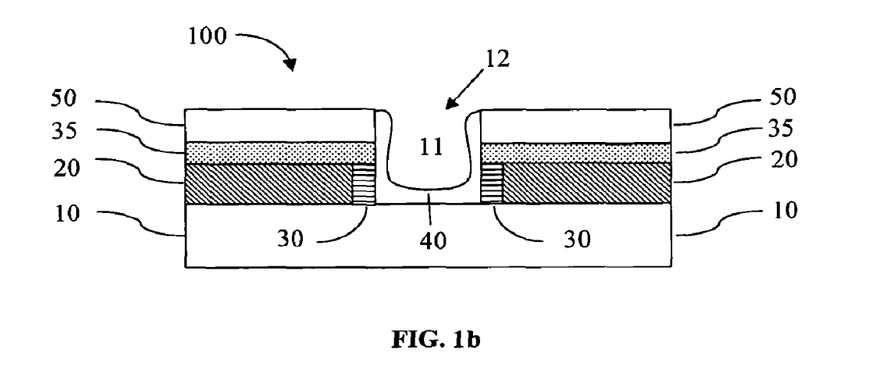

An example of a cavity-emission ELD structure is shown in FIG. 1b. The device 100 is constructed from a layered structure on a substrate 10 having a cavity 11 extending through the layered structure. The layered structure comprises a electron-injection electrode layer 20, an intermediate material (i.e., comprising an electron-accepting moiety according to the disclosure) 30, a dielectric layer 35, and an hole-injection electrode layer 50, wherein the dielectric layer is interposed between the hole-injection and electron-injection electrode layers. The cavity 11 extends from opening 12 entirely through the layered structure and terminates at the substrate 10. The cavity 11 may be, for example, in the shape of a cylinder, i.e., the cross-sectional area of the cavity is constant along its longitudinal axis. An electroluminescent material 40 is shown in general conformal contact with each region of the interior cavity surface. Conformal contact is preferred with each region of the interior cavity. At a minimum, however, the electroluminescent coating material must be provided electrical contact with both electrode regions of the interior cavity surface.

Figure 1C:
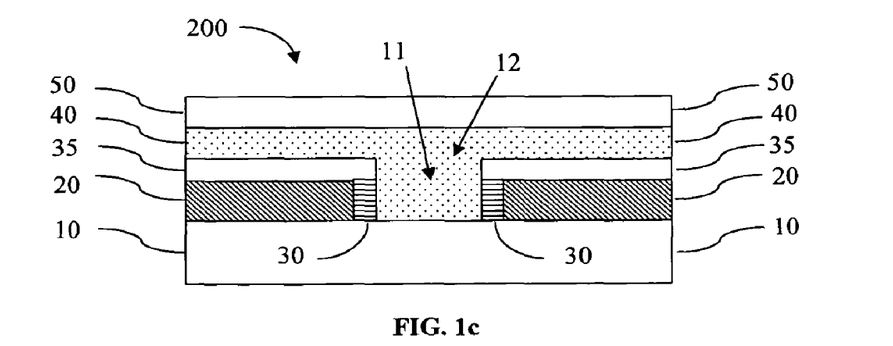

Another example of a cavity-emission ELD structure is shown in FIG. 1c. Device 200 is constructed from a layered structure on a substrate 10 having a cavity 11 extending through a portion of the layered structure. The layered structure comprises a electron-injection electrode layer 20, an intermediate material (i.e., comprising an electron-accepting moiety according to the disclosure) 30, a dielectric layer 35, a hole-injection electrode layer 50, and an electroluminescent material layer 40. The dielectric layer is interposed between the electron-injection electrode and the electroluminescent material so as to direct electrons through cavity 11.

The methods and devices disclosed herein have one or more advantages over those previously known. Such advantages include, for example, increased durability. Since the adhesive material of the intermediate layer is chemically bonded to the metal surface, the interface between the cathode metal and the EL layer is more durable. This allows, for example, the production of devices with longer device life. Another advantage is that the intermediate layer can be attached to the cathode substrate using solution-phase reaction chemistry, rather than the traditional method of forming layers using spin-coating. Particularly in cavity-emission ELD, this method allows more flexibility in forming the devices disclosed herein. Other advantages include: eliminating the use of environmentally sensitive metals, which may also provide devices with longer lifetimes; improved stability of the interface between the cathode and EL layer, thus reduce operating voltage and improve power efficiency and lifetime; simplified OLED display fabrication process and reduces cost; electron injection that is dependent of the intermediate chemical species but independent of the properties of the electrode metal (allowing selection of metal conductors that can be customized according to the individual need without affecting the performance of the cathode); simple tuning of the work function of the organic electrode by modifying the chemical structure of the intermediate species to meet the different needs for various LEPs; high relative quantum efficiencies.

EXAMPLES

Example 1

An example of the preparation of an ELD with an organic cathode structure is provided as follows. A silane derivative (i.e., aminophenyltrimethoxysilane) was reacted with the oxide of the metal surface to form a mono-layer of silane coating on the metal surface. Subsequently, 5-benzimidazole-carboxylic acid was attached to the surface by reacting with the exposed amine groups. It was found that a cavity OLED treated with this method has high quantum efficiency. An ITO surface treated with this process can function as a cathode in the traditional sandwich OLED structure.

Figure 2A:
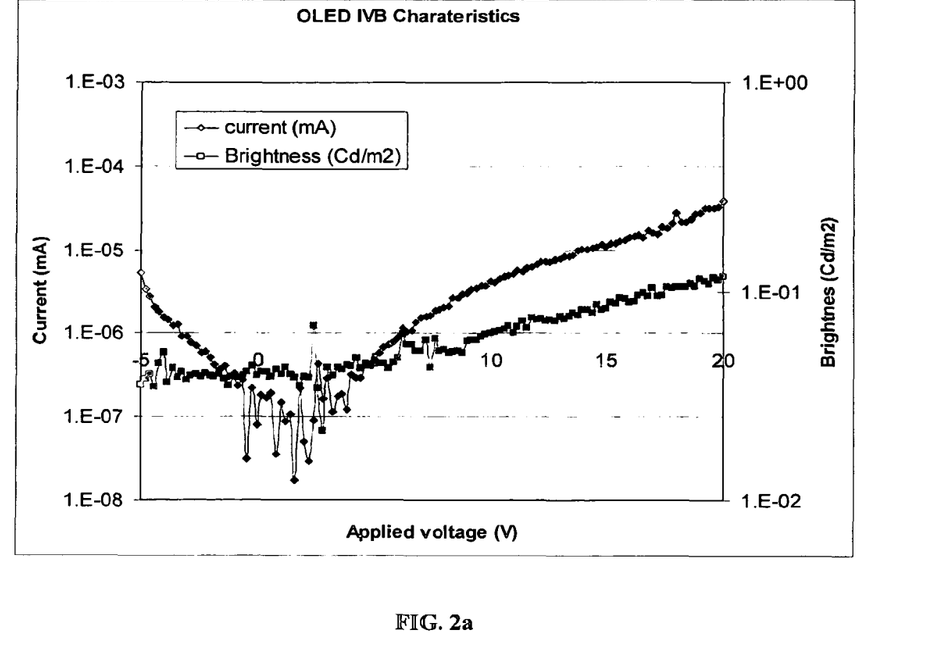
FIGS. 2a and 2b provide current-voltage-brightness (IVB) curves of electroluminescent devices according to the disclosure.

A cavity OLED using Pt as the anode, Al as the cathode, and prepared according to this process showed >40,000 times increase in quantum efficiency. The current-voltage-brightness (IVB) curves of such a device are shown in FIG. 2a. The improvement in the device quantum efficiency is significant.

Figure 2B:
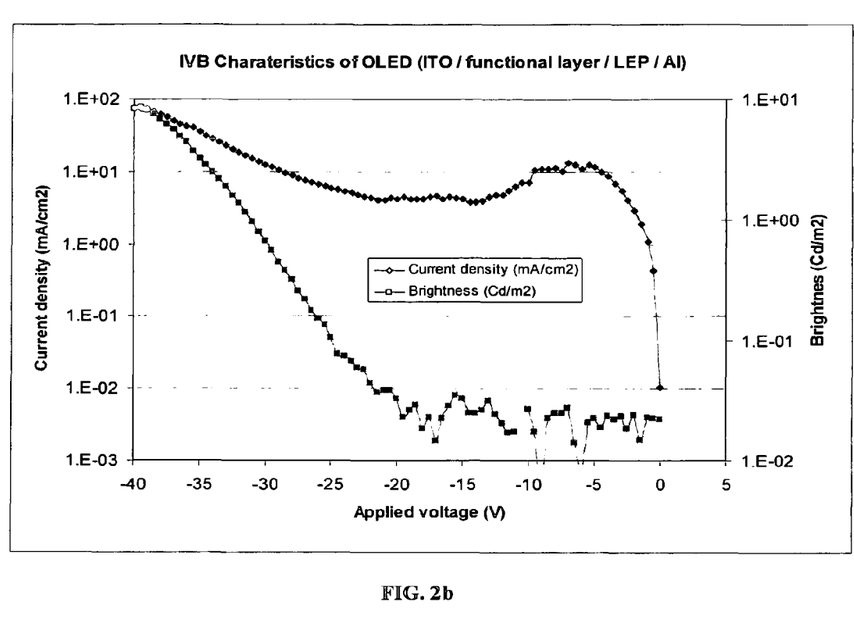

In another experiment, a sandwich OLED structure using ITO treated with the above method as the cathode and Al as the anode was fabricated. The device showed moderate light emission under reversed bias (modified ITO as cathode, Al as anode). Without the above surface treatment, such a device will be a "hole-only" device, which will not give any visible light emission under same conditions. The IVB curves of this device are shown in FIG. 2b.

Example 2

General. Barium acetylacetonate ($Ba(acac)_2$) is used as the electron injector. $Ba(acac)_2$ is mixed with a siloxane-type material, such as the pre-ceramic polymer. The mixture is subsequently applied to a metal electrode surface such as a thin film of Al. The siloxane material functions as an adhesive that attaches the electron injector ($Ba(acac)_2$) to the selected metal surface to form a stable cathode layer.

Substrate and device. COLED-A-type devices were prepared. The substrate is a 150 nm Mg—Al cathode layer. In addition to the intermediate layer, the devices include a 200 nm $Si_3N_4$ dielectric layer, and 25 nm Ti (adhesion layer)+150 nm Pt top electrode. Cavity-emission ELDs were created with cavity diameter/spacing=5/2 and 7/3 µm/µm.

Procedure. Using a procedure according to U.S. Pat. No. 5,246,738, polyhydridomethylsiloxane was converted to polyhydroxymethylsiloxane (PHMS-OH). Approximately 15 mg of $Ba(acac)_2$ was dissolved in 3 mL of 2-ethoxyethanol; then 0.1 mL of preceramic polymer (PHMS-OH) solution (5 wt % in 1-MeO-2-propanol acetate) was added. The mixture was filtered through a syringe filter into a 20 mL vial containing a COLED-A substrate. The vial is capped and placed into a sonication bath and sonicated for 1.5 minutes. The COLED-A substrate was then removed from the vial and washed with isopropanol; then blow dried with an $N_2$ gun. The substrate was baked in $N_2$ environment at 160° C. for 10 min. A light emitting polymer solution was subsequently spin-coated onto the substrate, which was then baked at 100° C. for 10 min. The device current density-voltage-brightness was determined for this device ("Gen-4 organic cathode") and compared to a COLED-A device without using the organic cathode ("Mg—Al cathode"). See FIG. 3.

Figure 3:
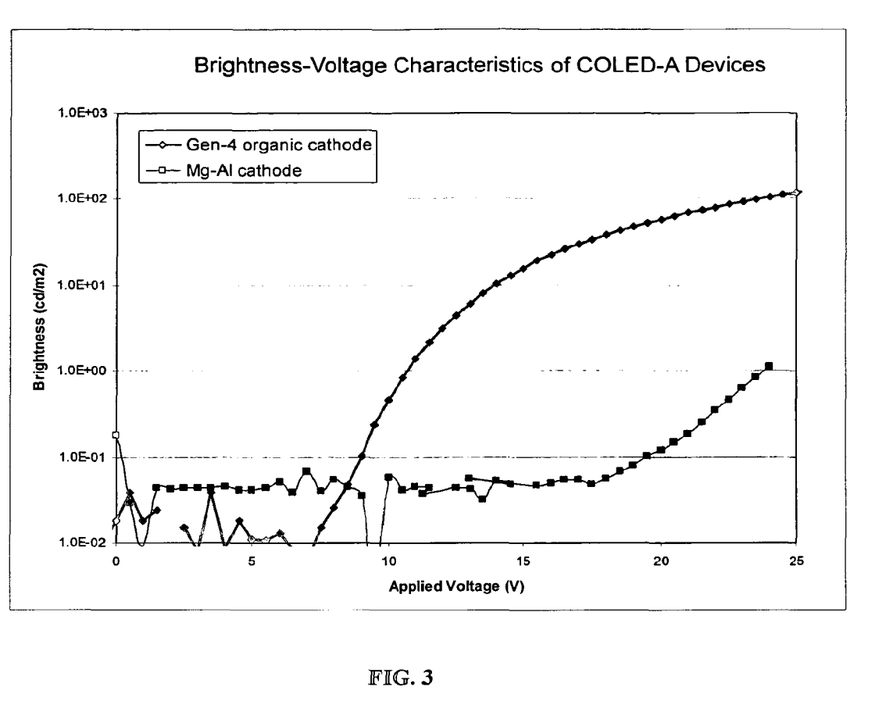
FIG. 3 provides current density-voltage-brightness curves for two electroluminescent devices.

The COLED-A device using the organic cathode had approximately 10 V lower turn on voltage, 100 times high brightness, and 2.5 times higher quantum efficiency as compared to the device not using the organic cathode. This approach allows selective deposition of the organic cathode on the cathode without contaminating the Pt anode. This approach can also be applied to the traditional planar OLED structure, i.e. depositing the organic cathode on ITO to convert ITO into a cathode with low work function (and evaporate a high work function anode, such as Au); or depositing an organic cathode on a non-transparent metal and using an ITO top electrode (top emitting configuration).

Example 3

Figure 4:
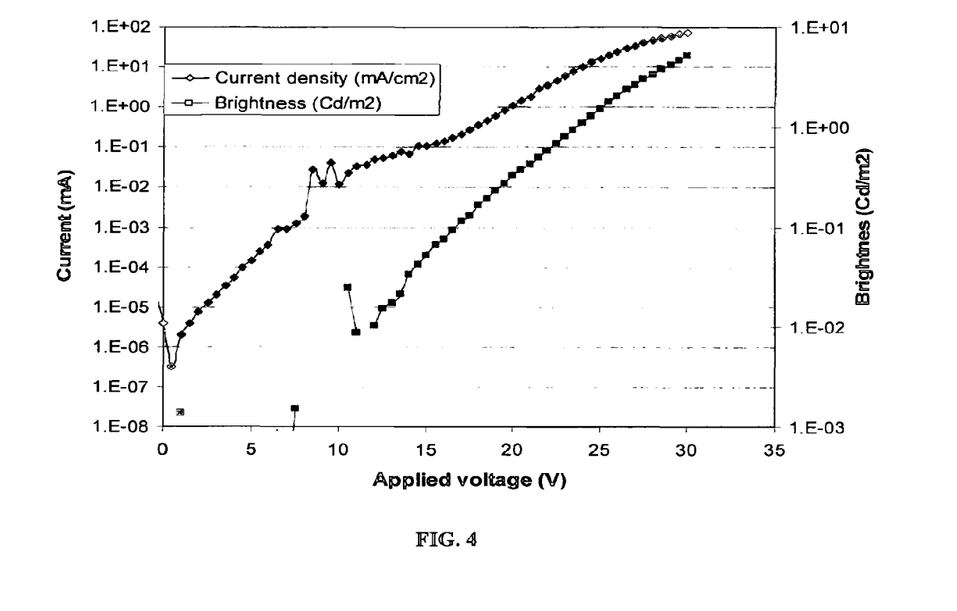
FIG. 4 provides current density-voltage-brightness curves for two electroluminescent devices.

Compounds 3-15 were deposited onto ITO/glass substrates using the above method and PLED devices were fabricated using the resulting organic cathodes. The anode was deposited by thermal evaporation of Au. A typical current density-voltage-brightness (JVB) characteristic of these devices, using a Green-K light-emitting polymer, an organic cathode (synthesized from compound 4), and a gold anode (evaporated) is shown in FIG. 4. The organic cathode had much better chemical stability than a Ca (i.e., Calcium metal) cathode. The device can operate in air without any encapsulation. In contrast, a PLED using a regular Ca cathode will fail in seconds if not encapsulated.

The fact that this device can produce reasonably strong light emission suggests that the work function of the ITO is reduced by attaching the organic molecules, since without the use of the organic cathode a PLED device using ITO as cathode and Au as anode will be a hole-only device that will not produce any photons under similar conditions.

What is claimed is:

1. An electroluminescent device (ELD) comprising an electron injection layer comprising a silicon-containing adhesive material and an electron-accepting moiety, wherein the adhesive material comprises polymer repeat units having the structure of formula (IIIa):

wherein $R^{12}$ is hydrocarbyl, and the wavy line represents a point of attachment to a cathode surface.

2. The ELD of claim 1, wherein the electron-accepting moiety is covalently attached to the adhesive material.

3. The ELD of claim 2, wherein the electron-accepting moiety is an organic species that has the structure of formula (Id)

wherein:
$R^{1a}$ is selected from H and a bond, provided that when $R^{1a}$ is a bond, then $R^{1a}$ and $R^2$ are taken together to form a cycle;
$R^2$, $R^3$, $R^4$, $R^5$, and $R^6$ are independently selected from H, hydrocarbyl, and a functional group; and
the wavy line represents the point of attachment of the organic species to the silicon-containing adhesive material.

4. The ELD of claim 2, wherein the electron-accepting moiety is a metal diketonate.

5. The ELD of claim 2, wherein the adhesive material is covalently attached to a metal or metal oxide surface, and the ELD further comprises an electroluminescent (EL) layer disposed on the electron injection layer, and wherein the difference in energy between the LUMO of the electron-accepting moiety and the LUMO of the EL material is less than the difference in energy between the LUMO of the metal and the LUMO of the EL material.

6. A method for forming an electron injection layer in an electroluminescent device, the method comprising: providing a metal or metal oxide surface having exposed hydroxyl groups, and forming a coating layer on the surface, wherein the coating layer is covalently bonded to the surface and comprises an electron accepting group, and wherein the coating layer is formed by a process comprising contacting the metal or metal oxide surface with a silicon-containing material comprising the electron accepting group.

7. A method for preparing a layered substrate for use in an electroluminescent device, the method comprising: providing a metal or metal oxide surface having exposed hydroxyl groups; and forming a cross-linked ceramic layer comprising an electron-accepting moiety, wherein the cross-linked ceramic layer is covalently attached to the surface through oxygen linkages, wherein the electron-accepting moiety is a metal diketonate.

8. The method of claim 6, wherein the method further comprises depositing a light-emitting polymer (LEP) layer on the coating layer, and wherein the difference in energy between the LUMO of the electron-accepting group and the LUMO of the LEP layer is less than the difference in energy between the LUMO of the metal or metal oxide and the LUMO of the LEP layer.

9. A method for forming an electron injection layer in an electroluminescent device, the method comprising: providing a metal or metal oxide surface having exposed hydroxyl groups, and forming a coating layer on the surface, wherein the coating layer is covalently bonded to the surface and comprises an electron accepting group, and wherein the coating layer is formed in a multi-step process comprising: covalently attaching and cross-linking an intermediate compound to the surface to form a cross-linked intermediate layer, wherein the intermediate compound comprises a cross-linkable moiety and a first functional group; providing a compound comprising the electron-accepting moiety and a second functional group, wherein the second functional group is capable of reacting with the first functional group to form a covalent linkage; and covalently linking the electron-accepting moiety to the cross-linked intermediate layer.

10. The method of claim 9, wherein the compound comprising the electron-accepting moiety and second functional group has the structure of formula (I)

wherein, in formula (I):
$R^1$ is $-C(=O)-X^1$, wherein $X^1$ is selected from $-OX^2$ and halide;
$R^2$, $R^3$, $R^4$, $R^5$, and $R^6$ are independently selected from H, hydrocarbyl, and a functional group; and
$X^2$ is selected from a bond, H or a hydrocarbyl group, provided that any two or more adjacent groups selected from $R^1$, $R^2$, $R^3$, $R^4$, $R^5$, and $R^6$ may be taken together to form a cyclic group.

11. A method for preparing a layered device comprising providing a surface having exposed hydroxyl groups, applying to the surface a composition comprising a metal diketonate and a preceramic material, and applying energy such that the preceramic material forms a cross-linked network covalently attached to the surface.

12. The ELD of claim 3, wherein the organic species has the structure of formula (Ie)

13. The ELD of claim 1, wherein $R^{12}$ is selected from $C_1$-$C_{20}$ alkyl, $C_2$-$C_{20}$ alkenyl, $C_2$-$C_{20}$ alkynyl, $C_5$-$C_{20}$ aryl, $C_6$-$C_{20}$ aralkyl, and $C_6$-$C_{20}$ alkaryl.

14. The ELD of claim 2, wherein $R^{12}$ is selected from $C_1$-$C_{20}$ alkyl, $C_2$-$C_{20}$ alkenyl, $C_2$-$C_{20}$ alkynyl, $C_5$-$C_{20}$ aryl, $C_6$-$C_{20}$ aralkyl, and $C_6$-$C_{20}$ alkaryl.

15. The ELD of claim 1, wherein $R^{12}$ is selected from substituted or unsubstituted $C_1$-$C_{20}$ alkyl, substitute or unsubstituted heteroatom-containing $C_1$-$C_{20}$ alkyl, substituted or unsubstituted $C_2$-$C_{20}$ alkenyl, substitute or unsubstituted heteroatom-containing $C_2$-$C_{20}$ alkenyl, substituted or unsubstituted $C_2$-$C_{20}$ alkynyl, substitute or unsubstituted heteroatom-containing $C_2$-$C_{20}$ alkynyl, substituted or unsubstituted $C_5$-$C_{20}$ aryl, substitute or unsubstituted $C_5$-$C_{20}$ heteroaryl, substituted or unsubstituted $C_5$-$C_{20}$ aralkyl, substitute or unsubstituted heteroatomcontaining $C_5$-$C_{20}$ aralkyl, substituted or unsubstituted $C_6$-$C_{20}$ alkaryl, and substitute or unsubstituted heteroatom-containing $C_5$-$C_{20}$ alkaryl.

* * * * *